(12) United States Patent
Yano et al.

(10) Patent No.: US 6,768,682 B2
(45) Date of Patent: Jul. 27, 2004

(54) NONVOLATILE SEMICONDUCTOR MEMORY AND METHOD FOR CONTROLLING PROGRAMMING VOLTAGE OF NONVOLATILE SEMICONDUCTOR MEMORY

(75) Inventors: Masaru Yano, Kawasaki (JP); Mototada Sakashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/259,761

(22) Filed: Sep. 30, 2002

(65) Prior Publication Data

US 2003/0107919 A1 Jun. 12, 2003

(30) Foreign Application Priority Data

Dec. 6, 2001 (JP) .......................................... 2001-372351

(51) Int. Cl.[7] .............................................. G11C 16/00
(52) U.S. Cl. .............................. 365/185.28; 365/185.19; 365/185.22
(58) Field of Search ...................... 365/185.28, 185.22, 365/185.23, 185.19

(56) References Cited

U.S. PATENT DOCUMENTS

| | | | | |
|---|---|---|---|---|
| 5,774,397 A | * | 6/1998 | Endoh et al. ............ | 365/185.19 |
| 5,812,457 A | * | 9/1998 | Arase ..................... | 365/185.22 |
| 6,134,148 A | * | 10/2000 | Kawahara et al. ..... | 365/185.28 |
| 6,392,931 B1 | * | 5/2002 | Pasotti et al. .......... | 365/185.19 |
| 6,490,204 B2 | * | 12/2002 | Bloom et al. .......... | 365/185.28 |

FOREIGN PATENT DOCUMENTS

JP        Hei 11-031391        2/1999

* cited by examiner

*Primary Examiner*—Tan T. Nguyen
(74) *Attorney, Agent, or Firm*—Arent Fox

(57) ABSTRACT

When data is programmed into nonvolatile memory cells, a programming voltage is applied, with increasing, to the memory cells a plurality of times. During this data programming, the increment of the programming voltage is set to a first voltage, which is maintained until the threshold voltages of all the memory cells to be programmed reach an initial value. Thereafter, the increment is set to a second voltage, which is maintained until the threshold voltages reach a target value. Increasing the programming voltage without varying the increment thereof allows the threshold voltages of the memory cells to approach the target value in a smaller number of times programmed. Additionally, setting the increment of the programming voltage to the second voltage after the threshold voltages exceed the initial value can minimize the deviation of the threshold voltages from the target value. Consequently, the programming time of the memory cells can be reduced.

16 Claims, 9 Drawing Sheets

NONVOLATILE SEMICONDUCTOR MEMORY AND METHOD FOR CONTROLLING PROGRAMMING VOLTAGE OF NONVOLATILE SEMICONDUCTOR MEMORY

BACKGROUND OF THE INVENTION

1. Field of the Invention

The present invention relates to a nonvolatile semiconductor memory and particularly to a technology for programming memory cells by gradually increasing a programming voltage.

2. Description of the Related Art

A technique disclosed in Japanese Unexamined Patent Application Publication No. Hei 11-31391 is known as a nonvolatile semiconductor memory in which memory cells are programmed by gradually increasing a programming voltage. In this technique, in order to set the threshold voltages of the memory cells to a target value with high accuracy, the increment of the programming voltage to be applied to the memory cells is gradually reduced.

In the above technique, however, since the increment of the programming voltage is gradually reduced, the variation amount of the threshold voltages is reduced as the threshold voltages approach the target value. That is, the variation amount of the threshold voltages decreases with increasing number of times programmed. For this reason, there was a problem that the higher the accuracy of setting the threshold voltages, the greater the number of times programmed in which the threshold voltages reach the target value. In other words, it was hard to establish compatibility between the improvement of the accuracy of the setting of the threshold voltages and the reduction of the programming time.

Besides, the increment of the programming voltage is made different each time a program is performed. Accordingly, the circuit for generating the programming voltage was complicated, resulting in a complicated layout design.

Recently, there has been developed a nonvolatile semiconductor memory having multilevel memory cells each capable of storing a plurality of bits of data. With respect to this kind of multilevel memory cells, setting the threshold voltage of each memory cell to a plurality of kinds of voltages causes each memory cell to store therein a plurality of bits of data. For example, with respect to four-level memory cells, it is necessary to program three kinds of threshold voltages into each memory cell in accordance with data. Thus, multilevel memory cells must be set with higher accuracy than two-level memory cells. Besides, the programming time of the multilevel memory cells must be reduced as much as possible.

SUMMARY OF THE INVENTION

It is an object of the present invention to reduce the programming time of nonvolatile semiconductor memories.

It is another object of the present invention to reduce the programming time in a nonvolatile semiconductor memory having multilevel memory cells, while controlling threshold voltages of the memory cells with high accuracy.

According to one of the aspects of the present invention, when data is programmed into a plurality of electrically data-rewritable nonvolatile memory cells, the programming voltage, while gradually increased, is applied to the memory cells a plurality of times. During this programming, the increment of the programming voltage is set to a first voltage, which is maintained until the threshold voltages of all the memory cells to be programmed reach an initial value. Thereafter, the increment of the programming voltage is set to a second voltage, which is maintained until the threshold voltages reach a target value. The settings of the first and second voltages and the generation of the programming voltage are performed by, for example, a programming voltage generator.

This way, the programming voltage is increased, with its increment not varied, until the threshold voltages of all the memory cells to be programmed reach the initial value. This allows those threshold voltages to get close to the target value in a smaller number of times programmed. Besides, setting the increment of the programming voltage to the second voltage after the threshold voltages exceed the initial value can minimize the deviation of the threshold voltages from the target value. As a result, the smaller number of times programmed allows the threshold voltages of the memory cells to be programmed with high accuracy. Also, since the number of times programmed is small, the time required to program the memory cells can be reduced.

In addition, since there are only two kinds of increments in the programming voltages, which are the first and second voltages, the programming voltage generator can be simply configured. Particularly, since there are fewer kinds of elements to be formed in the programming voltage generator, layout designing is easier.

According to another aspect of the present invention, since the first voltage is greater than the second voltage, there may be a fewer number of times programmed until the threshold voltages of the memory cells get close to the target value. The increment of the programming voltage becomes smaller after the threshold voltages get close to the target value. As a result, there may be less dispersion of the threshold voltages of the memory cells to be programmed.

According to another aspect of the present invention, a source line is connected to sources of the memory cells, while bit lines are connected to drains of the memory cells. When the threshold voltages are detected, a voltage setting circuit applies a predetermined gate voltage to control gates of the memory cells and applies a predetermined source voltage to the source line. At this moment, memory cell currents flow through the source-drain path of each of the memory cells, causing currents to occur in the respective bit lines. Threshold voltage detectors each detect the threshold voltages by the memory cell currents flowing through the respective bit lines. The threshold voltage detectors are connected to the bit lines, respectively. Accordingly, the threshold voltages of all the memory cells to be programmed can be detected at the same time. Thus, even when applying the programming voltage and detecting the threshold voltages a plurality of times, the programming time can be prevented from increasing.

According to another aspect of the present invention, when the threshold voltages are detected to have reached the initial value and the target value, the voltage setting circuit keeps the gate voltage constant in value and makes the source voltage different in value. Keeping the gate voltage constant in value during detecting the threshold voltages can maintain the gains of the memory cell transistors constant. For this reason, the threshold voltages can be detected with high accuracy.

Besides, since the initial value is lower than the target value, the memory cell currents of the initial value are greater than those of the target value. Accordingly, for example, when the source voltage during detecting the initial value is set to be higher than the source voltage during detecting the target value, the memory cell currents relatively decrease, so that the transient rise in voltage of the source line can be made small.

According to another aspect of the present invention, the threshold voltage detectors each include a latch circuit and a latch control circuit. The latch circuit holds program data to be programmed. The latch circuit outputs the data held therein to one of the bit lines during programming the memory cells. When the threshold voltages are detected to have reached the initial value and the target value, respectively, by variations in voltage of the bit lines, the latch control circuit inverts the data of the latch circuit. Accordingly, by only reading the data held by the latch circuits, it can be recognized that the threshold voltages of the memory cells have reached the initial value (or the target value). That is, the programming voltage to be applied in the next program can be easily obtained. Also, the latch circuits, having their data inverted, invert the levels to be outputted to the respective bit lines during the following programming. For this reason, the programming voltage can be prevented from further being applied to the memory cells whose threshold voltages have reached the initial value (or the target value). As a result, the threshold voltages can be prevented from dispersing.

According to another aspect of the present invention, data holding circuits are formed corresponding to the latch circuits, respectively. The data holding circuits hold the program data to be programmed into the memory cells. After the threshold voltages of the memory cells reach the initial value and the latch circuits are inverted, the data holding circuits transfer the program data held therein to the respective latch circuits. That is, after the program data held in the latch circuits are inverted in response to the detection of the initial value, correct program data are transferred to the latch circuits again. For this reason, when the programming voltage is thereafter applied to the memory cells with its increment changed to the second voltage, it can be applied only to the memory cells that need to be programmed.

According to another aspect of the present invention, data are programmed into multilevel memory cells each storing a plurality of bits of data. The data holding circuits are formed, corresponding to the latch circuits, respectively, to have an equal number of bits as in the data held by the multilevel memory cells. Forming the data holding circuits corresponding to the respective bits allows the program data corresponding to multilevel data to be transferred to each latch circuit after the data of the latch circuit is inverted. That is, a plurality of kinds of threshold voltages can be set for each memory cell in accordance with the multilevel data.

According to the present invention, the dispersion of threshold voltages of the memory cells from the target value can be made small, and hence a plurality of kinds of threshold voltages can be set with high accuracy for each multilevel memory cell, also. Since the dispersion of the threshold voltages is small, the multilevel data can be accurately programmed. Besides, since the number of times programmed is small, the programming time of the multilevel memory cells can be shortened, also.

According to another aspect of the present invention, the difference between the initial value and the target value is set as being greater than the dispersion of the threshold voltages of all the memory cells to be programmed when these threshold voltages have reached the initial value. For this reason, when the increment of the programming voltage is the first voltage, the threshold voltages can be prevented from exceeding the target value. In other words, part of memory cells whose threshold voltages have exceeded the target value can be prevented from further being programmed with the increment being the first voltage. As a result, the threshold voltages can be prevented from significantly deviating from the target value.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE PREFERRED EMBODIMENTS

Embodiments of the present invention will be described below with reference to the drawings.

Figure 1:
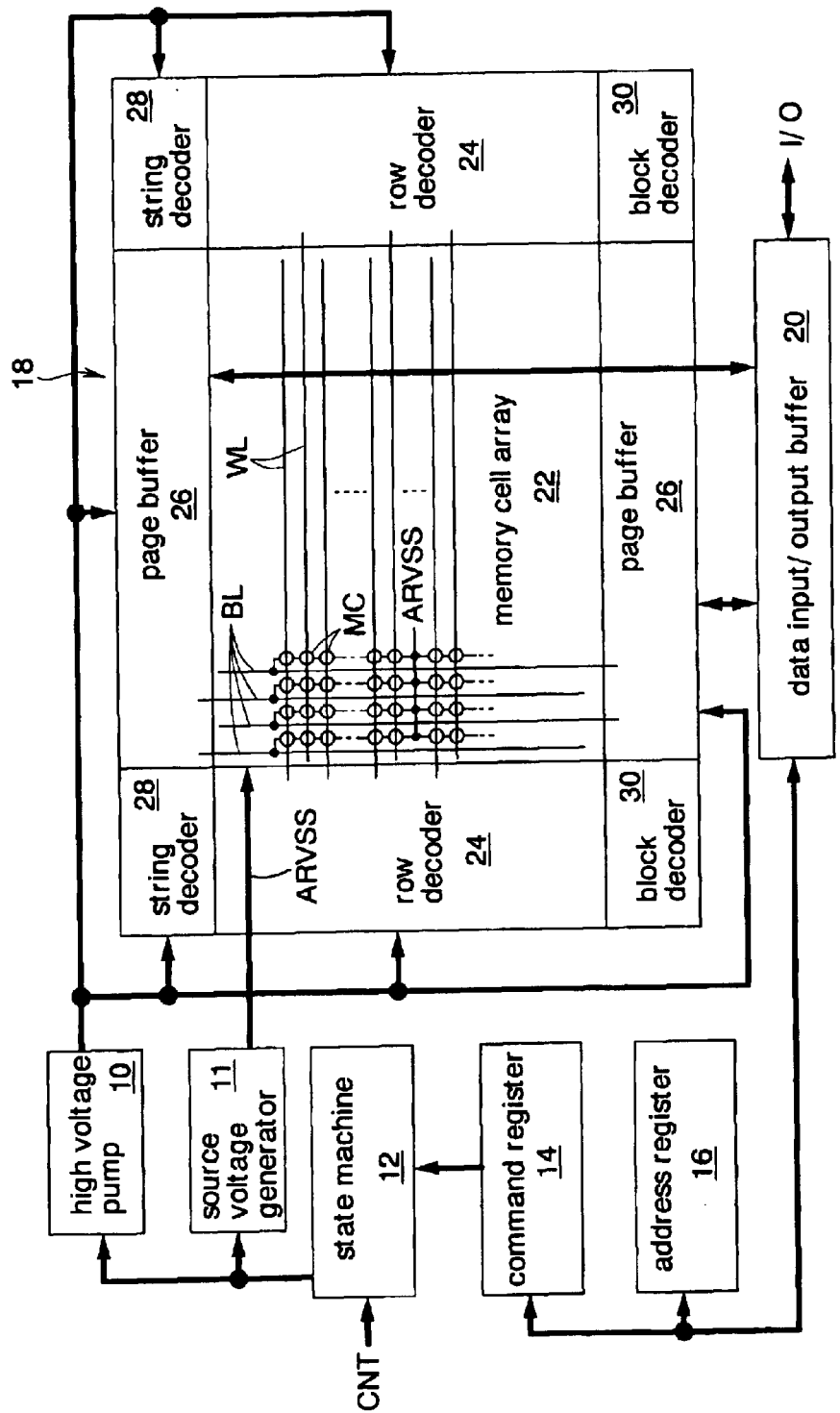
FIG. 1 is a block diagram showing an embodiment of the present invention.

FIG. 1 illustrates an embodiment of nonvolatile semiconductor memory and program control method therefor according to the present invention. The nonvolatile semiconductor memory of this embodiment is formed on a silicon substrate as a NAND-type flash memory of 64 megabits by use of a CMOS process.

The flash memory has a high voltage pump 10, a source voltage generator 11, a state machine 12, a command register 14, an address register 16, a memory core 18 and a data input/output buffer 20. The memory core 18 has a memory cell array 22, row decoders 24 formed on two opposite sides (left-hand and right-hand sides of FIG. 1) of the memory cell array 22, page buffers 26 formed on the other opposite sides (upper and lower sides of FIG. 1) of the memory cell array 22, string recorders 28 formed at ends (upper side of FIG. 1) of the respective row decoders 24, and block decoders 30 formed at the other ends (lower side of FIG. 1) of the respective row decoders 24.

The high voltage pump 10 receives control signals from the state machine 12, and generates and supplies high voltages, such as a programming voltage and so on, to the row decoders 24, page buffers 26 and string decoders 28. The source voltage generator 11 receives a control signal from the state machine 12, and generates and supplies a source voltage ARVSS to the memory cell array 22. The source voltage generator 11 operates as a voltage setting circuit for applying the source voltage ARVSS to the source line of memory cells MC that will be described later. The state machine 12 receives externally supplied control signals CNT (such as, a chip enable signal, a write enable signal and so on), also receives control signals from the command register 14, and generates, in response to the control signals, timing signals for executing read, write (programming) and erase operations.

The command register 14 receives, through the data input/output buffer 20, command signals supplied to an input/output terminal I/O, and outputs the received signals to the state machine 12. The address register 16 receives, through the data input/output buffer 20, address signals supplied to the input/output terminal I/O, and outputs the received signals to the row decoders 24 and to column decoders (not shown). The data input/output buffer 20 receives the command, address and data signals via the input/output terminal I/O. The data signals are inputted to and outputted from the page buffers 26.

The memory cell array 22 has electrically rewritable nonvolatile memory cells MC arranged in a matrix, word lines WL connected to the row decoders 24, and bit lines BL connected to the page buffers 26. The word lines WL are alternately connected to the respective left-hand and right-hand row decoders 24. Each word line WL is connected to, for example, 1 K bytes (two pages) of memory cells MC. The bit lines BL are alternately connected to the respective upper and lower page buffers 26. The page buffers 26 each input and output 512 bytes (one page) of data. The programming of the memory cells MC is performed in units of two pages. Sixteen memory cells MC are connected together in series between a respective bit line BL and a source line ARVSS. The memory cells MC connected to sixteen word lines WL constitute a block, which will be explained later with reference to FIG. 2.

The block decoders 30 each generate, in response to an address signal, a decoding signal for selecting a block. The row decoders 24 each select, in response to the decoding signal outputted from the respective block decoder 30, select the block. The string decoders 28 each select, in response to the address signal, select one of the sixteen word lines WL the selected block.

Figure 2:
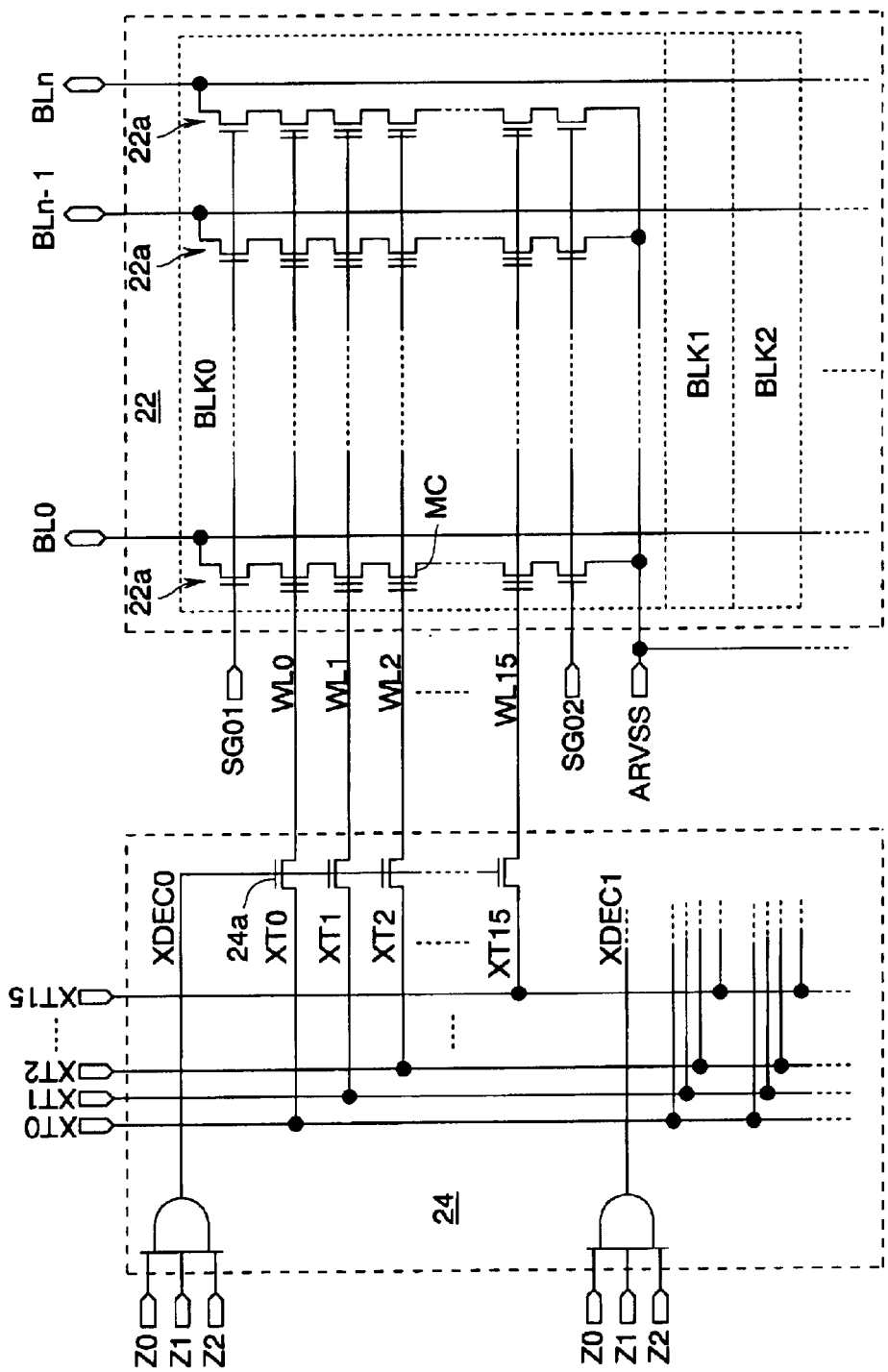
FIG. 2 is a circuit diagram showing the essential portions of the memory cell array and row decoders of FIG. 1.

FIG. 2 illustrates essential portions of the memory cell array 22 and row decoders 24. In FIG. 2, the two row decoders 24 as shown in FIG. 1 are illustrated as one for purposes of simple explanation.

The memory cell array 22 is composed of a plurality of blocks BLK (BLK0, BLK1 . . . ). Each block BLK has NAND-type memory cell columns 22*a* corresponding to the respective bit lines BL. In each memory cell column 22*a*, sixteen memory cells, each having a control gate and a floating gate, are arranged in series. The control gate of each memory cell MC is connected to a respective word line WL (WL0–15). Either end of each memory cell column 22*a* is connected to a respective bit line BL or a common source line ARVSS via a respective selecting transistor, the gate of which is connected to a respective selecting line SG (SG01, SG02).

The word lines WL0–15 are connected through respective transfer switches 24*a* (nMOS transistors) of the row decoders 24 to respective string lines XT0–15. These string lines XT0–15, connected to the outputs of the string decoders 28, serve as signal lines each common to the plurality of blocks BLK. The gate of each transfer switch 24*a* receives a decoding signal XDEC (XDEC0, XDEC1 . . . ) of the associated row decoder 24. The decoding signal XDEC is activated by decoding signals Z0, Z1 and Z2 outputted from the associated block decoder 30. The row decoders 24 each also operate as a voltage setting circuit for applying a gate voltage to the control gate of each memory cell MC.

The operation of the memory cells MC will now be explained below in brief.

The programming operation of the memory cells MC is initiated by inputting programming data and thereafter inputting a command for initiating the programming. The word line WL corresponding to memory cells MC to be programmed is supplied with a high voltage (e.g., 18 V), while the bit lines BL are supplied with zero volts. Then, the memory cells MC are programmed by using FN tunneling to inject electrons into the floating gates of the memory cells MC. (Logics 0 are written. The threshold voltages become high.)

The reading operation of the memory cells MC is initiated by inputting a command for reading data. The word line WL corresponding to memory cells MC from which data are to be read is supplied with a low voltage (e.g., zero volts). The other word lines WL and the selecting lines SG are supplied with a high level (e.g., 4V). The source line ARVSS is supplied with a low voltage (e.g., zero volts). When electrons are trapped in a floating gate (a programmed state), no channel is formed through the memory cells MC, so that the source line ARVSS and bit line BL are not rendered conductive with each other. When no electrons are trapped in the floating gates (an erased state), a channel is formed through the memory cells MC, so that the source line ARVSS and bit line BL are rendered conductive with each other. Then, the data are read from the 1 K bytes of memory cells MC connected to the word line WL. Actually, the memory cell currents flowing through the respective bit lines BL are detected by the page buffers 26, whereby the logic levels of the data stored in the memory cells MC are determined.

The erasing operation of the memory cells MC is initiated by inputting a command for erasing the data. The control gates of memory cells MC from which the data are to be erased are supplied with a low voltage (e.g., zero volts). The well regions of the memory cells MC are supplied with a high voltage (e.g., 20V). Then, the electrons trapped in floating gates are emitted therefrom, whereby the data of the memory cells MC are erased. (The logic levels change from 0 to 1. The threshold voltages become low.) At this moment, the word lines WL other than the ones connected to the memory cells MC from which the data are to be erased (the control gates of the memory cells MC connected to those other word lines WL) are brought into a floating state, for example.

Figure 3:
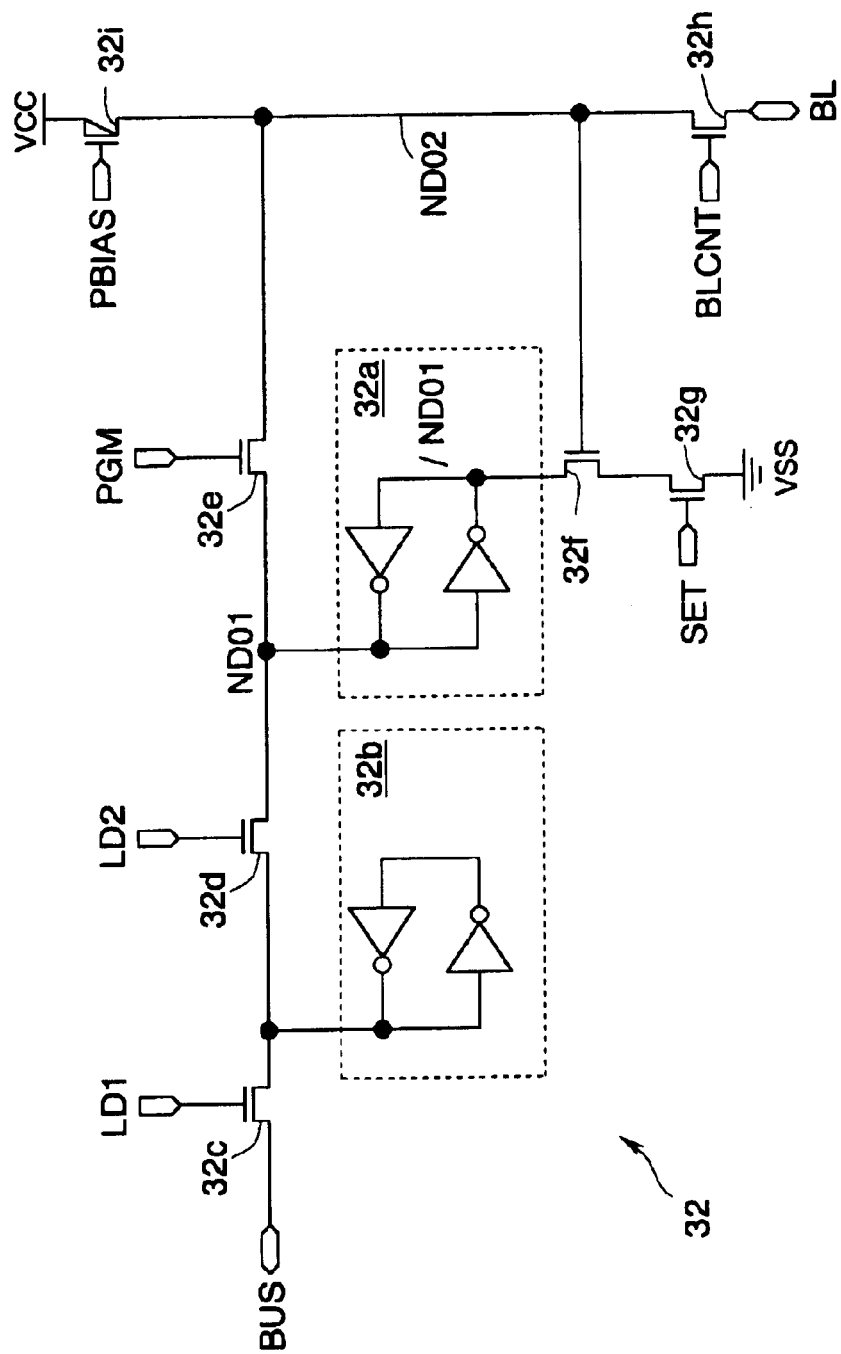
FIG. 3 is a circuit diagram showing a threshold voltage detector.

FIG. 3 shows one of threshold voltage detectors 32 formed in the page buffers 26 shown in FIG. 1. The threshold voltage detectors 32 each also function as a data latch for holding data with which to program the memory cells MC.

Each threshold voltage detector 32 has a latch circuit 32*a* and a data holding circuit 32*b*, and further has nMOS transistors 32*c*, 32*d*, 32*e*, 32*f*, 32*g*, and 32*h* and a pMOS transistor 32*i* that operate as switches. The nMOS and PMOS transistors each will be referred to simply as nMOS or PMOS hereinafter. The latch and data holding circuits 32*a* and 32*b* each are configured by connecting the inputs and outputs of two inverters with each other.

The output of the latch circuit 32*a* (a node ND01) is connected to a data bus BUS via the nMOSes 32*c* and 32*d*. The gate of the nMOS 32*c* is controlled by a load signal LD1. The gate of the nMOS 32*d* is controlled by a load signal LD2. The node ND01 of the latch circuit 32*a* is connected to a node ND02 via the nMOS 32*e*. The gate of the nMOS 32*e* is controlled by a programming control signal PGM. A node /ND01 of the latch circuit 32*a* is connected to a ground line VSS via the nMOSes 32*f* and 32*g*. The gate of the nMOS 32*f* is connected to the node ND02. The gate of the nMOS 32*g* is controlled by a setting signal SET. The nMOSes 32*f* and 32*g* operate together as a latch control circuit for inverting the data of the latch circuit 32*a* in accordance with the voltage of the bit line BL.

The node ND02 is connected to the bit line BL via the nMOS 32*h*, the gate of which is controlled by a bit line control signal BLCNT. The node ND02 is also connected through the pMOS 32*i* to a power supply line VCC. The gate of the pMOS 32*i* is controlled by a bias signal PBIAS. The data holding circuit 32*b* is connected through the nMOS 32*c* to the data bus BUS.

Figure 4:
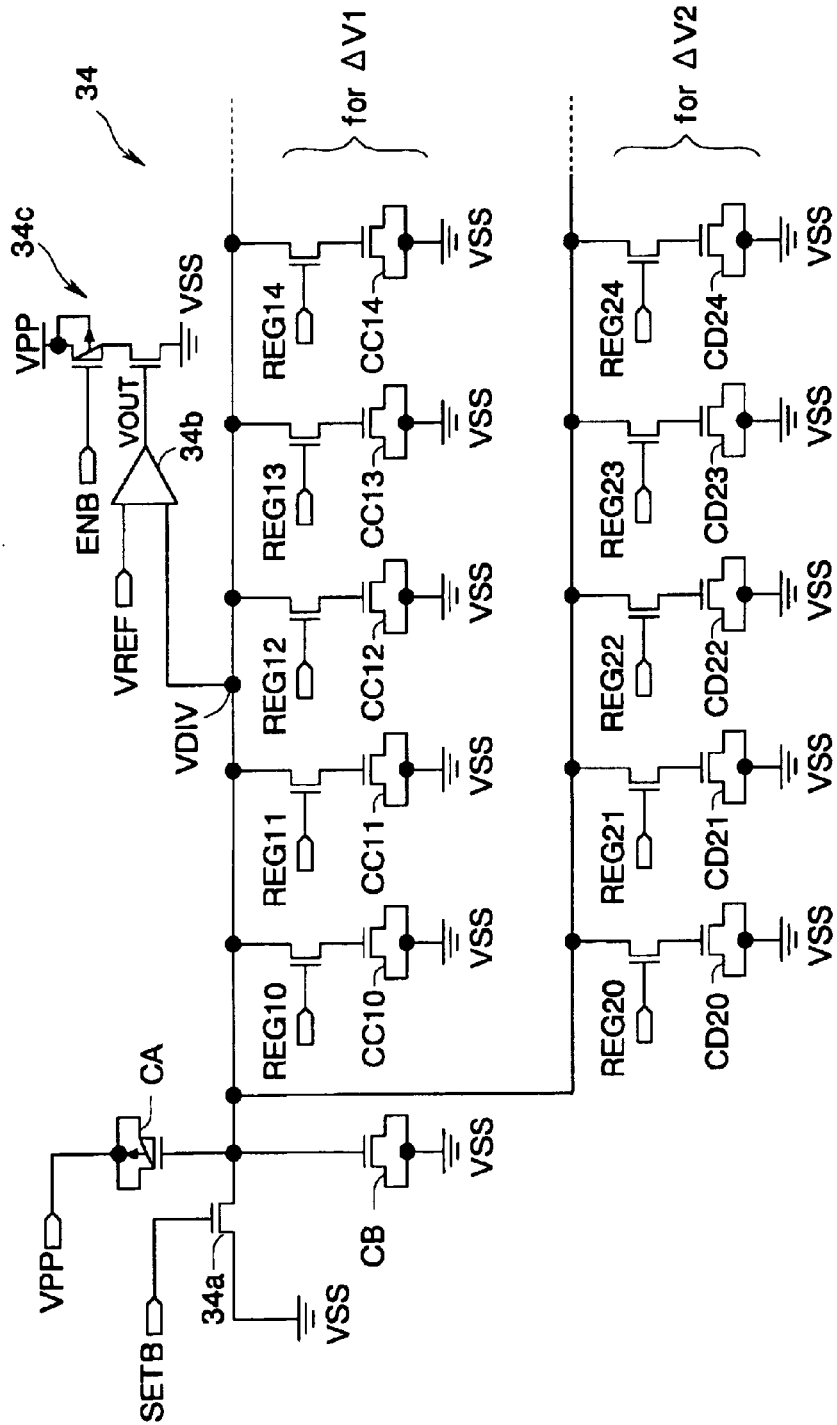
FIG. 4 is a circuit diagram showing a programming voltage generator.

FIG. 4 shows a programming voltage generator 34 formed in the high voltage pump 10 of FIG. 1. The programming voltage generator 34 has capacitances CA and CB whose respective one ends are connected to a node VDIV, a plurality of capacitances CC (CC10, CC11, CC12 . . . ) connected through respective nMOSes to the node VDIV, a plurality of capacitances CD (CD20, CD21, CD22 . . . ) connected through respective nMOSes to the node VDIV, an nMOS 34*a* for connecting the node VDIV to the ground line VSS, a differential amplifier 34*b*, and a VPP adjusting circuit 34*c*.

The capacitance CA is constituted by a pMOS, while the capacitances CB, CC and CD are constituted by nMOSes. The capacitances CC are connected to the node VDIV via the respective nMOSes that are controlled by respective control signals REG (REG10, REG11, REG12 . . . ). The capacitances CD are connected to the node VDIV via the respective nMOSes that are controlled by respective control signals REG (REG20, REG21, REG22 . . . ). The nMOS 34*a* is controlled by a setting signal SETB. The respective other ends of the capacitances CA and CB are connected to the boost voltage VPP and the ground voltage VSS, respectively.

The differential amplifier 34*b* receives a reference voltage VREF (1.3 V) and a voltage of the node VDIV (hereinafter referred to as divided voltage VDIV) and outputs a control voltage VOUT. This control voltage VOUT becomes high when the divided voltage VDIV is higher than the reference voltage VREF. Conversely, the control voltage VOUT becomes low when the divided voltage VDIV is lower than the reference voltage VREF. The VPP adjusting circuit 34*c* has a pMOS and an nMOS that are connected together in series between the boost voltage line VPP and the ground line VSS. The gate of the pMOS is supplied with an enable signal ENB that changes to a low level when the flash memory is programmed. The gate of the nMOS is supplied with the control voltage VOUT.

In this programming voltage generator 34, control signals REG are caused to change to a high level to connect additional capacitances CC or CD to the node VDIV, thereby reducing the divided voltage VDIV in accordance with the added capacitances. The differential amplifier 34*b* and VPP adjusting circuit 34*c* provide such a feedback control that the divided voltage VDIV is always equal to the reference voltage VREF. As a result, each connection of one capacitance CC raises the boost voltage VPP (programming voltage PVPP) by $\Delta V1$ (a first voltage), while each connection of one capacitance CD raises the boost voltage VPP (programming voltage PVPP) by $\Delta V2$ (a second voltage). In the present embodiment, the number of kinds of increments in the programming voltage is established as two. As a result, the number of kinds of capacitances to be formed in the programming voltage generator 34 can be made small, which facilitates the layout design.

Next, the programming operation of the flash memory described above will now be explained below.

Figure 5:
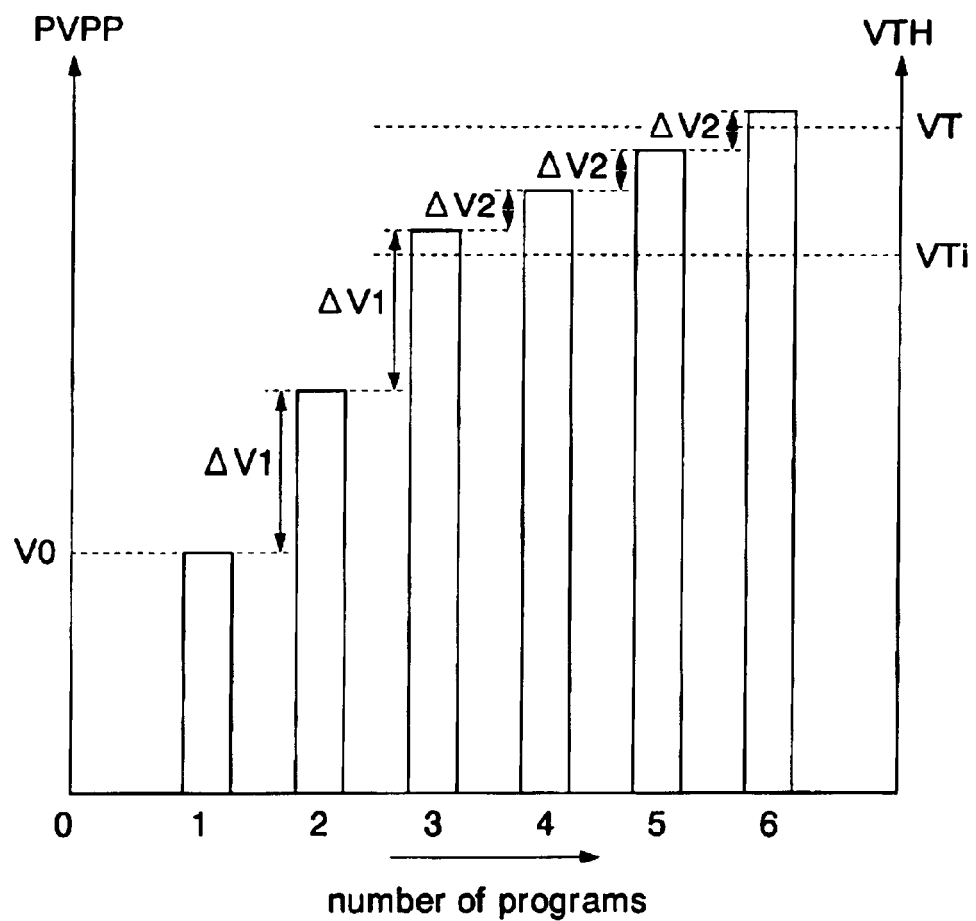
FIG. 5 is an explanatory diagram showing the programming voltage to be applied to the memory cells.

FIG. 5 shows the programming voltage PVPP to be applied to the control gates of the memory cells MC. The programming voltage PVPP is the voltage of the node VDIV shown in FIG. 4. In the present embodiment, during programming the memory cells MC, the programming voltage PVPP is gradually increased, while it is applied to the memory cells MC a plurality of times. The increment of the programming voltage PVPP is set to $\Delta V1$ (the first voltage), which is maintained until the threshold voltages of all the memory cells MC to be programmed reach an initial value VTi. Thereafter, the increment of the programming voltage PVPP is set to $\Delta V2$ (the second voltage), which is maintained until those threshold voltages reach a target value VT.

At first, when the programming is initiated, the programming voltage PVPP is set to a voltage V0, which is a voltage obtained by the capacitance division of the capacitances CA and CB of the programming voltage generator 34 shown in FIG. 4. The first program is performed by applying the voltage V0 to the control gates of the memory cells MC to be programmed. The memory cells MC to be programmed will be also referred to as programmed cells PMC hereinafter. The voltage V0 is also applied to the memory cells MC that need not be programmed. For this reason, with respect to these memory cells MC, the bit lines BL associated therewith are caused to exhibit a high level such that the gate-to-channel voltages of the memory cells MC are reduced, thereby preventing the application of the programming voltage. At this moment, the latch circuits 32*a* of the associated threshold voltage detectors 32 as shown in FIG. 3 are caused to latch logic 1, thereby applying the high level to the bit lines BL. Actually, the high level of the bit lines BL is further raised by the coupling of the parasitic capacitances of selected transistors of the memory cell columns 22*a* shown in FIG. 2, and then applied to the drains of the memory cells MC.

After programming with the voltage V0, the threshold voltage of each programmed cell PMC is detected. This threshold voltage detection is performed by the threshold voltage detector 32 of FIG. 3. Logic 0 (low level) has been inputted through the data bus to the latch and data holding circuits 32*a* and 32*b* corresponding to each programmed cell PMC, while logic 1 (high level) has been inputted through the data bus to the latch and data holding circuits 32*a* and 32*b* corresponding to each memory cell MC that is not to be programmed.

Firstly, while the nMOS 32*h* is kept off, the pMOS 32*i* is kept on for a predetermined time period, thereby precharging the node ND02 at the high level. Meanwhile, the nMOS 32*g* is kept off, and hence the data of the latch circuit 32*a* is not corrupted.

Figure 6:
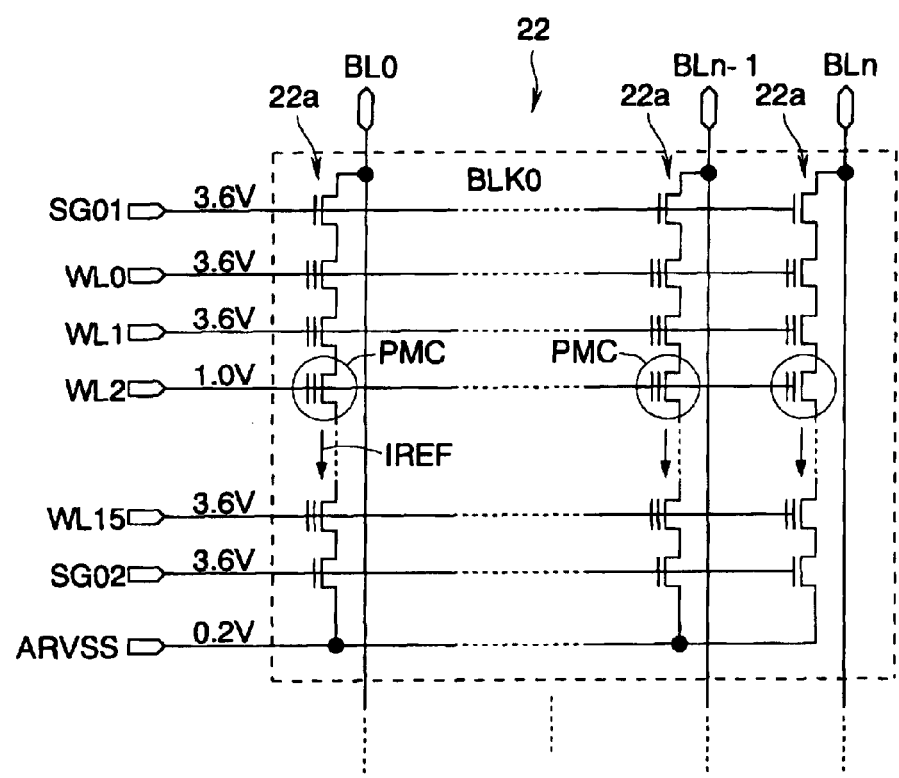
FIG. 6 is an explanatory diagram showing the voltages at the essential nodes for detecting whether the memory cell threshold voltages have reached the initial value.

Next, as shown in FIG. 6, the word line WL connected to programmed cells PMC is supplied with 1.0 V, the other word lines WL are supplied with 3.6 V, and the source line ARVSS is supplied with 0.2 V. Thereafter, the bit line control signal BLCNT and setting signal SET shown in FIG. 3 are caused to change to a high level, thereby turning on the nMOSes 32*h* and 32*g*. In a case when the threshold voltages of the memory cells MC have reached the initial value VTi (0.8 V in the present example), the source-to-drain paths of the programmed cells PMC are not conductive. That is, the bit lines BL and source line ARVSS are not conductive with each other, and hence the node ND02 of the threshold voltage detector 32 of FIG. 3 corresponding to each bit line BL is kept at the high level. The high level of the node ND02 turns on the nMOS 32f. Accordingly, the nodes /ND01 and ND01 of the latch circuit 32a corresponding to each memory cell MC to be programmed are caused to change to low and high levels, respectively. That is, the data of the latch circuit 32a corresponding to each memory cell MC whose threshold level has reached the initial value VTi is inverted. As a result, during the following programs using the increment of $\Delta V1$, the bit lines BL are caused to exhibit the high level. Thus, with respect to the memory cells MC whose threshold levels have reached the initial value VTi, the programming is prevented from being executed by the programming voltage PVPP.

On the other hand, in a case when the threshold voltages of the memory cells MC have not reached the initial value VTi, the source-drain paths of the programmed cells PMC are conductive. That is, the bit lines BL and source line ARVSS are conductive with each other, and hence each node ND02 changes to the low level. Since the nMOS 32f is not kept on, the data of the latch circuit 32a does not change. In the present example, it is determined that the first application of the programming voltage has not caused the threshold voltages of the programmed cells PMC to reach the initial value VTi.

Since the threshold voltage detectors 32 are formed corresponding to the respective bit lines BL, the threshold voltages of all the memory cells MC connected to any word line WL can be detected at the same time. As a result, increase in the programming time can be prevented.

Next, the high voltage pump 10 causes the control signal REG10 shown in FIG. 4 to change to a high level, thereby connecting the capacitance CC10 to the node VDIV. This connection causes the divided voltage VDIV to decrease by a predetermined value and become lower than the reference voltage VREF. The differential amplifier 34b reduces the control voltage VOUT in accordance with the change of the divided voltage VDIV. The reduction of the control voltage VOUT causes the on-resistance of the nMOS of the VPP adjusting circuit 34c to rise, which reduces the amount of the leakage from the boost voltage line VPP to the ground line VSS. Accordingly, the boost voltage VPP rises.

The rise of the boost voltage VPP causes the divided voltage VDIV to rise. In this way, the feedback control of the differential amplifier 34b and VPP adjusting circuit 34c causes the divided voltage VDIV to rise until it becomes equal to the reference voltage VREF. Accordingly, the boost voltage VPP (the programming voltage PVPP) rises by $\Delta V1$ (the first voltage). Similarly to the above, the second program is then executed, and the threshold voltages of the programmed cells PMC are detected. In the present example, after the second program, it is detected that the threshold voltages of the programmed cells PMC have not reached the initial value VTi.

Next, the high voltage pump 10 causes the control signal REG11 in addition to the control signal REG10 to change to a high level, thereby connecting the capacitances CC10 and CC11 to the node VDIV. This connection causes the divided voltage VDIV to decrease by the predetermined value and become lower than the reference voltage VREF. Similarly to the above, the feedback control of the differential amplifier 34b and VPP adjusting circuit 34c then causes the boost voltage VPP (the programming voltage PVPP) to further rise by $\Delta V1$ (the first voltage). Then, the third programming voltage PVPP is applied to the programmed cells PMC.

It is detected, in the present example, that the third program has caused the threshold voltages of all the programmed cells PMC to exceed the initial value VTi. This way, the programming voltage PVPP is increased, without changing the increment thereof, until the threshold voltages of the programmed cells PMC reach the initial value VTi. This allows the threshold voltages of the programmed cells PMC to get close to the target value VT with a smaller number of times programmed.

Since it has been detected that the threshold voltages of all the programmed cells PMC exceeded the initial value VTi, the data of all the latch circuits 32a (FIG. 3) have been inverted. This renders the nMOSes 32d on, causing the data of the data holding circuits 32b (correct programming data) to be transferred to the latch circuits 32a. In order to allow the latch circuits 32a to latch the correct programming data, the drive capability of the data holding circuits 32b must be higher than that of the latch circuits 32a.

Figure 7:
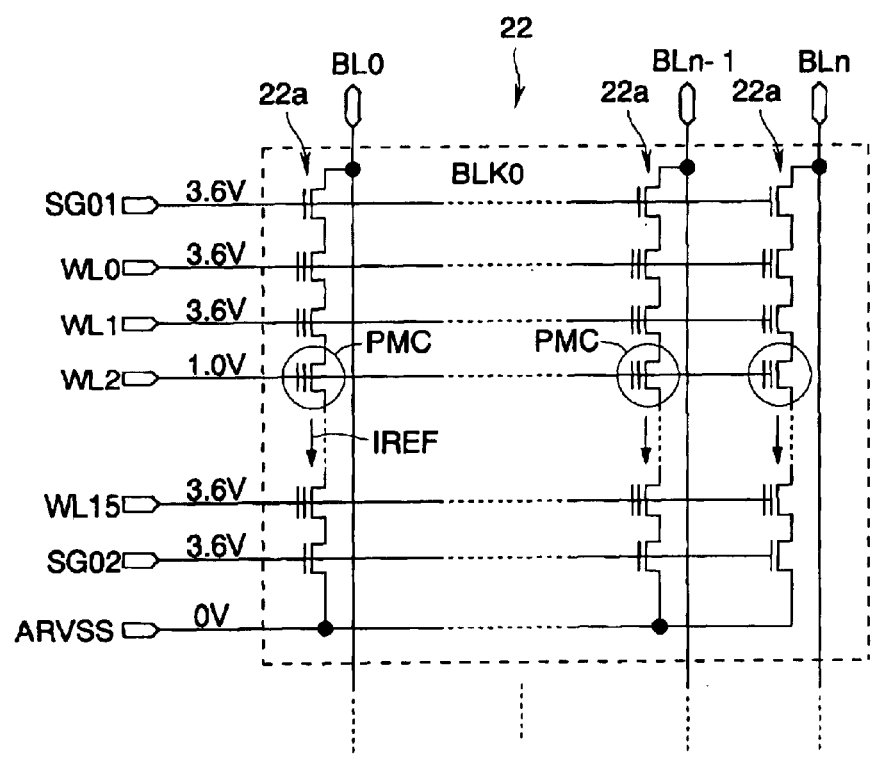
FIG. 7 is an explanatory diagram showing the voltages at the essential nodes for detecting whether the memory cell threshold voltages have reached the target value.

Next, the high voltage pump 10 causes the control signal REG22 in addition to the control signals REG10 and REG11 to change to a high level, thereby connecting the capacitances CC10 and CC11 and the capacitance CD22 to the node VDIV. This connection causes the boost voltage VPP (the programming voltage PVPP) to further rise by $\Delta V2$ (the second voltage). This programming voltage PVPP is applied to the programmed cells PMC, thereby performing the fourth program. Thereafter, as shown in FIG. 7, the word line WL connected to the programmed cells PMC is supplied with 1.0 V, the other word lines are supplied with 3.6 V, and the source line ARVSS is supplied with 0 V. The voltages of the bit lines BL change in accordance with memory cell currents IREF flowing through the source-drain paths of the programmed cells PMC. This voltage change is utilized to detect whether or not the threshold voltages of the programmed cells PMC have reached the target value VT.

Here, when the threshold voltages are to be detected, the gate voltages are kept constant (1.0 V), while the source voltages are caused to be different (0.2 V and 0 V). Keeping the gate voltages constant allows the gains of the memory cell transistors to be constant. For this reason, the threshold voltages can be detected accurately. Also, causing the source voltages during detecting the initial value VTi to be higher than those during detecting the target value VT can relatively reduce the memory cell currents IREF, thereby diminishing the transient rise in voltage of the source line.

Thereafter, the programming voltage PVPP is incremented $\Delta V2$ by $\Delta V2$ until the threshold voltages of the programmed cells PMC exceed the target value VT. In this way, the fifth and sixth programs are performed. The data of the latch circuits 32a corresponding to the programmed cells PMC whose threshold voltages have exceeded the target value VT are inverted. Since the bit lines BL are supplied with the high level after those data inversions, the programmed cells PMC whose threshold voltages have exceeded the target value VT are not programmed any more.

Then, when it is detected, from the data held in the latch circuits 32a, that the threshold voltages of all the memory cells MC to be programmed have reached the target value VT (after the sixth program), the programming of the memory cells MC is completed.

Figure 8:
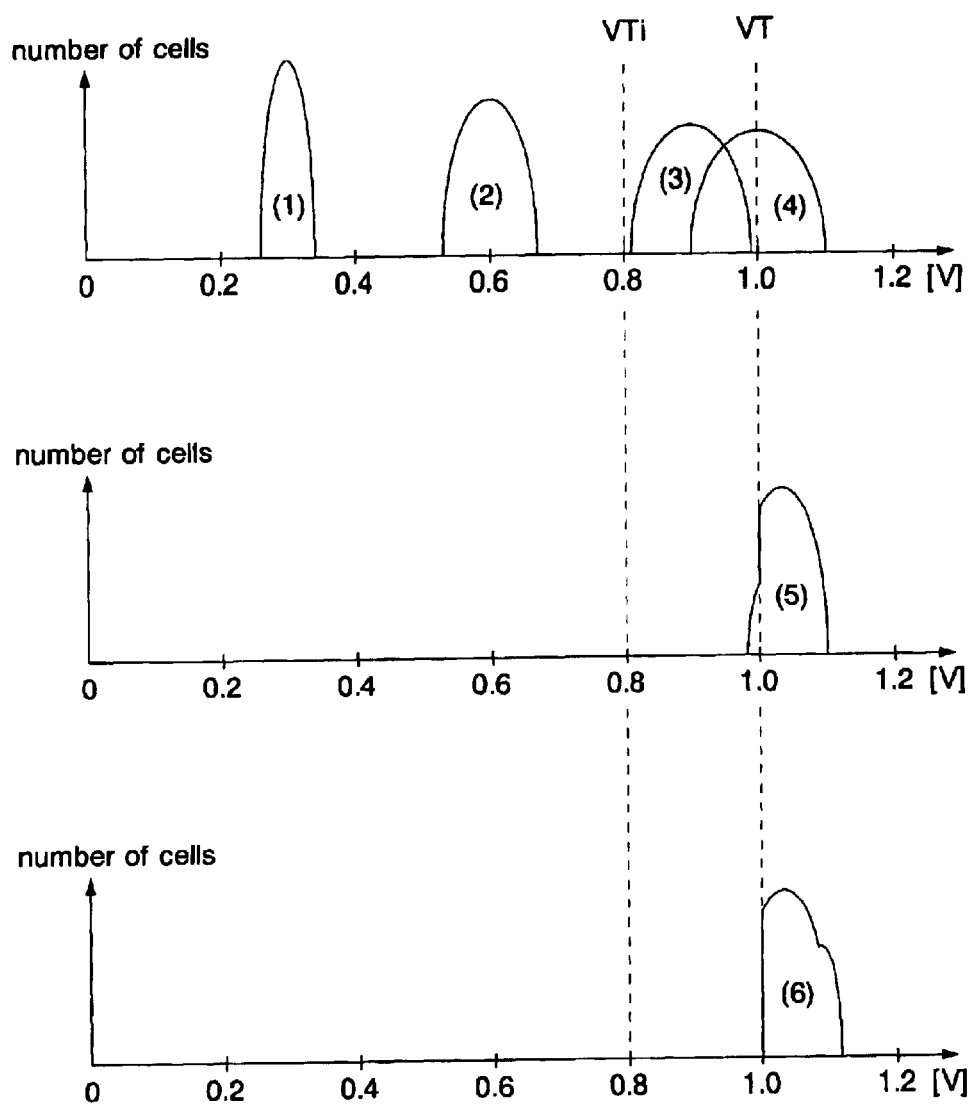
FIG. 8 is an explanatory diagram showing variations in distribution of the memory cell threshold voltages during programming the memory cells.

FIG. 8 shows an example of variation in distribution of the threshold voltages of the programmed cells PMC during the programming operation of the memory cells MC shown in FIG. 5. Distributions (1) through (6) represent the distributions of threshold voltages provided after the first through sixth programs of FIG. 5, respectively. The initial programming voltage V0 is set to 0.3 V. The increments ΔV1 and ΔV2 of the programming voltage are set to 0.3 V and 0.1 V, respectively. The initial value VTi and target value VT are set to 0.8 V and 1.0 V, respectively.

In the present example, after the third program, the threshold voltages of all the programmed cells PMC exceed the initial value VTi (0.8 V). The initial value VTi and target value VT have been established such that an end of the distribution (on the higher voltage side) do not exceed the target value VT (1.0 V) at this moment. In other words, the initial value VTi and target value VT have been established such that when the threshold voltages of all the programmed cells PMC have reached the initial value VTi, the difference between the initial value VTi and the target value VT is greater than the dispersion of those threshold voltages. Accordingly, in any program where the increment of the programming voltage PVPP is ΔV1, the threshold voltages do not exceed the target value VT. Thus, the threshold voltages are prevented from deviating significantly from the target value VT.

As a result, in the present example, the ultimate dispersion of the threshold voltages of the programmed cells PMC can be constrained to approximately 0.1 V. That is, the threshold voltages of the programmed cells PMC can be controlled with high accuracy. Contrarily, if the difference between the initial value VTi and the target value VT were smaller than the dispersion of the threshold voltages, the threshold voltages of a part of the programmed cells PMC would exceed the target value VT in a program using the increment of ΔV1. At this moment, the threshold voltages of another part of the programmed cells PMC would not reach the initial value VTi. For this reason, the programmed cells PMC whose threshold voltages have exceeded the target value VT would be further programmed with the increment of the programming voltage PVPP being ΔV1. Consequently, the dispersion of the threshold voltages would be as large as approximately 0.3 V.

The setting of the initial value VTi and target value VT may be finely adjusted in accordance with the characteristics of the flash memory as manufactured, whereby the threshold voltages can be set more accurately. This only requires the provision of a threshold voltage adjusting circuit that can perform a plurality of variations of setting the initial value VTi and target value VT and the provision of a fuse circuit that establishes circuit connections in this threshold voltage adjusting circuit. A nonvolatile memory may be utilized instead of the fuse circuit. Then, the characteristics of the flash memory in each manufacturing lot, for example, may be measured, thereby deciding the blowout specification of the fuse. In this way, the initial value VTi and target value VT can be set optimally.

In the fourth and following programs, since the threshold voltages of all the programmed cells PMC have exceeded the initial value VTi, the increment of the programming voltage is set to ΔV2 (0.1 V). The fourth program causes the threshold voltages of nearly half of the memory cells MC that are to be programmed to reach the target value VT. The programmed cells PMC whose threshold voltages have reached the target value VT are not further programmed in the following programs. Then the sixth program results in the threshold voltages of all the programmed cells PMC having reached the target value VT, and hence the programming operation is completed.

In the present embodiment of nonvolatile semiconductor memory and program control method therefor described above, the increment of the programming voltage PVPP was fixed to ΔV1 until the threshold voltages of the programmed cells PMC reached the initial value VTi. For this reason, a small number of programs can cause the threshold voltages of the programmed cells PMC to get close to the target value VT. Besides, after the threshold voltages of all the programmed cells PMC exceeded the initial value VTi, the increment of the programming voltage PVPP was caused to change to ΔV2 smaller than ΔV1. In this way, after the threshold voltages get close to the target value VT, the increment of the programming voltage can be made small. Accordingly, the deviation of the threshold voltages from the target value VT can be minimized. As a result, a small number of programs can program the threshold voltages of the memory cells with high accuracy. For example, the dispersion of the threshold voltages can be constrained to approximately 0.1 V. Since the number of programs is small, the time required to program the memory cells can be reduced.

There are only two kinds of increments in the programming voltage PVPP. For this reason, the programming voltage generator 34 can be simply configured. In particular, since there are fewer kinds of capacitances to be formed in the programming voltage generator 34, layout designing is easier.

The threshold voltage detectors 32 were formed corresponding to the respective bit lines BL. For this reason, the threshold voltages of the programmed cells PMC can be detected at the same time. Thus, the programming time can be prevented from increasing.

When the threshold voltages were detected, the gate voltages were kept constant, while only the source voltages were caused to be different. For this reason, the gains of the memory cell transistors can be maintained constant, so that the threshold voltages can be detected with high accuracy. Besides, the source voltages during detecting the initial value VTi were caused to be higher than those during detecting the target value VT, thereby relatively reducing the memory cell currents IREF. Accordingly, the transient rise in voltage of the source line can be diminished.

When the threshold voltages reached the initial value VTi and when they reached the target value VT, the data of the latch circuits 32a were inverted. For this reason, it can be recognized only by reading the data held in the latch circuits 32a that the threshold voltages of the programmed cells PMC have reached the initial value VTi (or the target value VT). Besides, the latch circuits 32a whose data have been inverted can prevent the programming voltage PVPP from further being applied to the programmed cells PMC whose threshold voltages have reached the initial value VTi (or the target value VT). As a result, the threshold voltages can be prevented from dispersing.

The data holding circuits 32b for holding program data were formed corresponding to the respective latch circuits 32a. For this reason, after the data of the latch circuits 32a are inverted, correct program data can be transferred to the latch circuits 32a again. As a result, the following programs can be correctly performed.

The difference between the target and initial values was set to be greater than the dispersion of the threshold voltages of the programmed cells PMC when those threshold voltages reached the initial value. For this reason, programmed cells PMC whose threshold voltages have exceeded the target value VT can be prevented from further being programmed with the increment being ΔV1. As a result, the threshold voltages can be prevented from significantly deviating from the target value VT.

Figure 9:
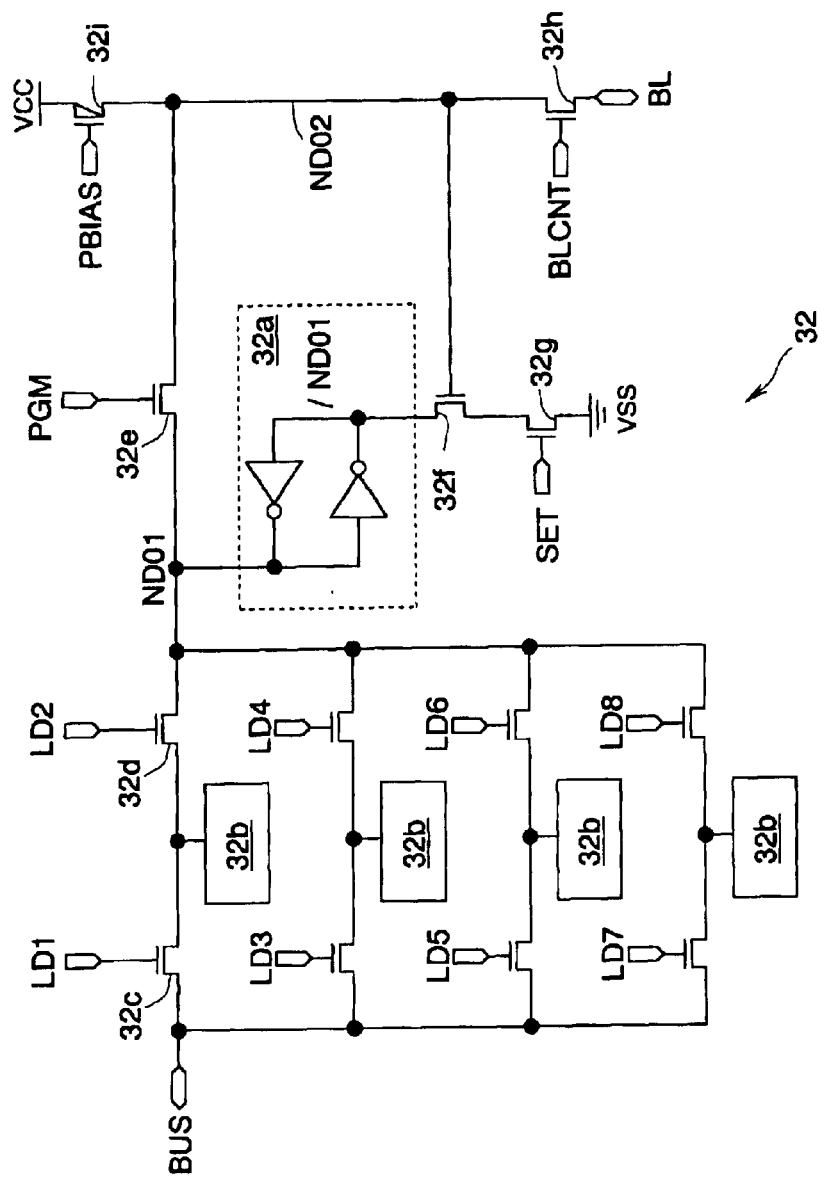
FIG. 9 is a circuit diagram showing another threshold voltage detector.

The foregoing embodiment was described as an example where the present invention was applied to the flash memory having the nonvolatile memory cells each storing two levels. The present invention, however, is not limited to this example but may be applied to the flash memory having nonvolatile memory cells each storing four or more levels, for example. In such a case, as shown in FIG. 9, there are formed data holding circuits 32b to have an equal number of bits as in the data held by the multilevel memory cells. Forming the data holding circuits 32b corresponding to the respective bits allows the program data corresponding to multilevel data to be transferred to each latch circuit 32a after the data of the latch circuit 32a is inverted. That is, a plurality of kinds of threshold voltages can be set for each memory cell in accordance with the multilevel data.

According to the present invention, the dispersion of the threshold voltages of the memory cells from the target value can be made small, and hence a plurality of kinds of threshold voltages can be set, with high accuracy, for each multilevel memory cell, also. Since the dispersion of the threshold voltages is small, the multilevel data can be accurately programmed. Besides, the number of times programmed is small, the programming time can be shortened with the multilevel memory cells, also.

The foregoing embodiment was described as an example where the present invention was applied to the flash memory. The present invention, however, is not limited to this example but may be applied to a flash memory core to be mounted on a system LSI, for example.

The foregoing embodiment was described as an example where the present invention was applied to the NAND-type flash memory. The present invention, however, is not limited to this example but may be applied to, for example, a NOR-type flash memory, or a nonvolatile semiconductor memory other than the flash memories.

The invention is not limited to the above embodiments and various modifications may be made without departing from the spirit and scope of the invention. Any improvement may be made in part or all of the components.

What is claimed:

1. A nonvolatile semiconductor memory comprising:
   a plurality of electrically data-rewritable nonvolatile memory cells;
   a source line connected to sources of said memory cells;
   bit lines connected to drains of said memory cells;
   a programming voltage generator for generating a programming voltage to be applied to said memory cells a plurality of times;
   threshold voltage detectors respectively connected to said bit lines for detecting threshold voltages by memory cell currents flowing through said bit lines; and
   a voltage setting circuit for applying a predetermined gate voltage to control gates of said memory cells and applying a predetermined source voltage to said source line when said threshold voltages are detected, wherein
   said programming voltage generator sets the increment of said programming voltage to a first voltage, which is maintained until said threshold voltages of all said memory cells to be programmed reach an initial value, and then sets said increment to a second voltage, which is maintained until said threshold voltages of all said memory cells reach a target value.

2. The nonvolatile semiconductor memory according to claim 1,
   wherein said first voltage is higher than said second voltage.

3. The nonvolatile semiconductor memory according to claim 1, wherein said voltage setting circuit keeps said gate voltage constant in value and makes said source voltage different in value when said threshold voltages are detected to have reached said initial value and said target value, respectively.

4. The nonvolatile semiconductor memory according to claim 1, wherein said threshold voltage detectors each include:
   a latch circuit for holding program data to be programmed, whose output is connected to one of said bit lines during programming said memory cells; and
   a latch control circuit for detecting, by the voltage of one of said bit lines, that the threshold voltages have reached said initial value and said target value, respectively, and inverting said latch circuit.

5. The nonvolatile semiconductor memory according to claim 4, further comprising data holding circuits corresponding to said latch circuits, respectively, for holding said program data to be transferred to the latch circuit after the latch circuit is inverted.

6. The nonvolatile semiconductor memory according to claim 5, wherein:
   said memory cells each are multilevel memory cells for storing a plurality of bits of data; and
   said data holding circuits are formed, corresponding to said latch circuits, respectively, to have the same number of bits as that of the data held by said multilevel memory cells.

7. The nonvolatile semiconductor memory according to claim 1, wherein the difference between said initial value and said target value is set as being greater than the dispersion of the threshold voltages of all said memory cells to be programmed, when the threshold voltages of all said memory cells have reached said initial value.

8. A method for controlling a programming voltage of a nonvolatile semiconductor memory having a plurality of electrically data-rewritable nonvolatile memory cells, the method comprising the steps of:
   setting the increment of said programming voltage to a first voltage and increasing and applying said programming voltage to said memory cells;
   detecting that threshold voltages of all said memory cells to be programmed have reached an initial value;
   setting the increment of said programming voltage to a second voltage in response to the detection, and increasing and applying said programming voltage to said memory cells until said threshold voltages reach a target value; and
   programming data into said memory cells.

9. A nonvolatile semiconductor memory comprising:
   a plurality of electrically data-rewritable nonvolatile memory cells;
   a programming voltage generator for generating a programming voltage to be applied to said memory cells a plurality of times; and
   threshold voltage detectors for detecting that threshold voltages of all said memory cells to be programmed have reached an initial value, wherein
   said programming voltage generator sets the increment of said programming voltage to a first voltage before the detection is done by said threshold voltage detectors, and then sets said increment to a second voltage in response to the detection.

10. The nonvolatile semiconductor memory according to claim 9, wherein said first voltage is higher than said second voltage.

11. The nonvolatile semiconductor memory according to claim 9, further comprising:

a source line connected to sources of said memory cells;

bit lines connected to drains of said memory cells; and a voltage setting circuit for applying a predetermined gate voltage to control gates of said memory cells and applying a predetermined source voltage to said source line when said threshold voltages are detected, wherein said threshold voltage detectors are respectively connected to said bit lines and detect said threshold voltages by memory cell currents flowing through said bit lines.

12. The nonvolatile semiconductor memory according to claim 11, wherein said voltage setting circuit keeps said gate voltage constant in value and makes said source voltage different in value when said threshold voltages are detected to have reached said initial value and said target value, respectively.

13. The nonvolatile semiconductor memory according to claim 11, wherein said threshold voltage detectors each include:

a latch circuit for holding program data to be programmed, whose output is connected to one of said bit lines during programming said memory cells; and a latch control circuit for detecting, by the voltage of one of said bit lines, that the threshold voltages have reached said initial value and said target value, respectively, and inverting said latch circuit.

14. The nonvolatile semiconductor memory according to claim 13, further comprising data holding circuits corresponding to said latch circuits, respectively, for holding said program data to be transferred to the latch circuit after the latch circuit is inverted.

15. The nonvolatile semiconductor memory according to claim 14, wherein:

said memory cells each are multilevel memory cells for storing a plurality of bits of data; and said data holding circuits are formed, corresponding to said latch circuits, respectively, to have the same number of bits as that of the data held by said multilevel memory cells.

16. The nonvolatile semiconductor memory according to claim 9, wherein the difference between said initial value and said target value is set as being greater than the dispersion of the threshold voltages of all said memory cells to be programmed, when the threshold voltages of all said memory cells have reached said initial value.

* * * * *